United States Patent
Ishikawa

(10) Patent No.: US 11,778,795 B2
(45) Date of Patent: Oct. 3, 2023

(54) CALCULATION DEVICE

(71) Applicant: FUJI CORPORATION, Chiryu (JP)

(72) Inventor: Nobuyuki Ishikawa, Nagoya (JP)

(73) Assignee: FUJI CORPORATION, Chiryu (JP)

(*) Notice: Subject to any disclaimer, the term of this patent is extended or adjusted under 35 U.S.C. 154(b) by 829 days.

(21) Appl. No.: 16/759,582

(22) PCT Filed: Nov. 17, 2017

(86) PCT No.: PCT/JP2017/041454
§ 371 (c)(1),
(2) Date: Apr. 27, 2020

(87) PCT Pub. No.: WO2019/097671
PCT Pub. Date: May 23, 2019

(65) Prior Publication Data
US 2020/0275589 A1    Aug. 27, 2020

(51) Int. Cl.
*H05K 13/00*     (2006.01)
*H05K 13/04*     (2006.01)
*G05B 19/418*    (2006.01)
*G05B 19/4155*   (2006.01)

(52) U.S. Cl.
CPC ..... *H05K 13/0015* (2013.01); *G05B 19/4155* (2013.01); *G05B 19/41805* (2013.01); *H05K 13/0411* (2018.08); *G05B 2219/45026* (2013.01)

(58) Field of Classification Search
None
See application file for complete search history.

(56) References Cited

U.S. PATENT DOCUMENTS

2020/0015397 A1* 1/2020 Kitagawa ............. H05K 13/085
2020/0170120 A1* 5/2020 Hashimoto ........ H05K 13/0812
2020/0275591 A1* 8/2020 Imura ................ H05K 13/0409

FOREIGN PATENT DOCUMENTS

| JP | 2-5499 A | 1/1990 |
| JP | 9-130095 A | 5/1997 |
| JP | 2014-143365 A | 8/2014 |
| JP | 2016-4987 A | 1/2016 |
| WO | WO 2013/183123 A1 | 12/2013 |

OTHER PUBLICATIONS

International Search Report dated Feb. 6, 2018 in PCT/JP2017/041454 filed Nov, 17, 2017, 1 page.

* cited by examiner

*Primary Examiner* — Ryan A Jarrett
(74) *Attorney, Agent, or Firm* — Oblon, McClelland, Maier & Neustadt, L.L.P.

(57) ABSTRACT

A calculation device for a work machine comprising a holding head including a holding tool configured to hold a lead component comprising a lead and a body and a moving device configured to move the holding head, the calculation device calculating a release position of the lead component held by the holding tool, when the work machine mounts the lead component on a board by inserting the lead of the lead component held by the holding tool into a hole formed on the board by operating the moving device.

5 Claims, 13 Drawing Sheets

CALCULATION DEVICE

TECHNICAL FIELD

The disclosure relates to a calculation device configured to calculate a release position of a lead component which is held by a holding tool when a work machine mounts the lead component on a board by inserting a lead of the lead component held by the holding tool into a hole of the board.

BACKGROUND ART

Since multiple components are mounted on a board, when mounting a mounting target component, that is, a held component which is held by a holding tool on the board, there is a possibility that the held component interferes with a pre-loaded component which has been mounted on the board before the held component. To avoid this, when mounting the held component on the board, the interference of the held component with the pre-loaded component is prevented as described in the following patent literature.

Patent Literature 1: JP-A-9-130095

BRIEF SUMMARY

Technical Problem

The disclosure solves a problem of how to preferably prevent an interference of a held component with a pre-loaded component mounted on a board when the held component is mounted on the board.

Solution to Problem

In order to solve the problem, according to the description, there is disclosed a calculation device for a work machine comprising a holding head including a holding tool configured to hold a lead component comprising a lead and a body and a moving device configured to move the holding head, the calculation device calculating a release position of the lead component held by the holding tool, when the work machine mounts the lead component on a board by inserting the lead of the lead component held by the holding tool into a hole formed on the board by operating the moving device, in which the calculation device is configured to calculate, when a held component constituting the lead component held by the holding tool is mounted on the board, a height to the held component as a release height at which the held component is released by the holding tool, the height to the held component being the height allowing the lead to be inserted into the hole without interference of the body of the held component and a pre-loaded component already mounted on the board, the calculation being performed based on a dimension of the pre-loaded component, a dimension of the lead of the held component, and a dimension of the holding tool.

Advantageous Effects

According to the disclosure, the body of the held component is prevented from interfering with the pre-loaded component when the held component is mounted on the board, and the height to the held component at which the lead can be inserted into the hole in the board is calculated as the release height for the held component at which the held component is released by the holding tool based on the dimension of the pre-loaded component, the dimension of the lead of the held component, and the dimension of the holding tool. Then, when the holding tool releases the held component at the calculated release height, the held component descends on its own weight or the like in a state of the body of the held component being separated from the board, so that the lead is inserted into the hole in the board. As a result, the held component can preferably be prevented from interfering with the pre-loaded component when the held component is mounted on the board.

DESCRIPTION OF EMBODIMENT

Hereinafter, an embodiment of the disclosure will be described in detail while referring to drawings as a mode for carrying out the disclosure.

Configuration of Component Mounter

Figure 1:
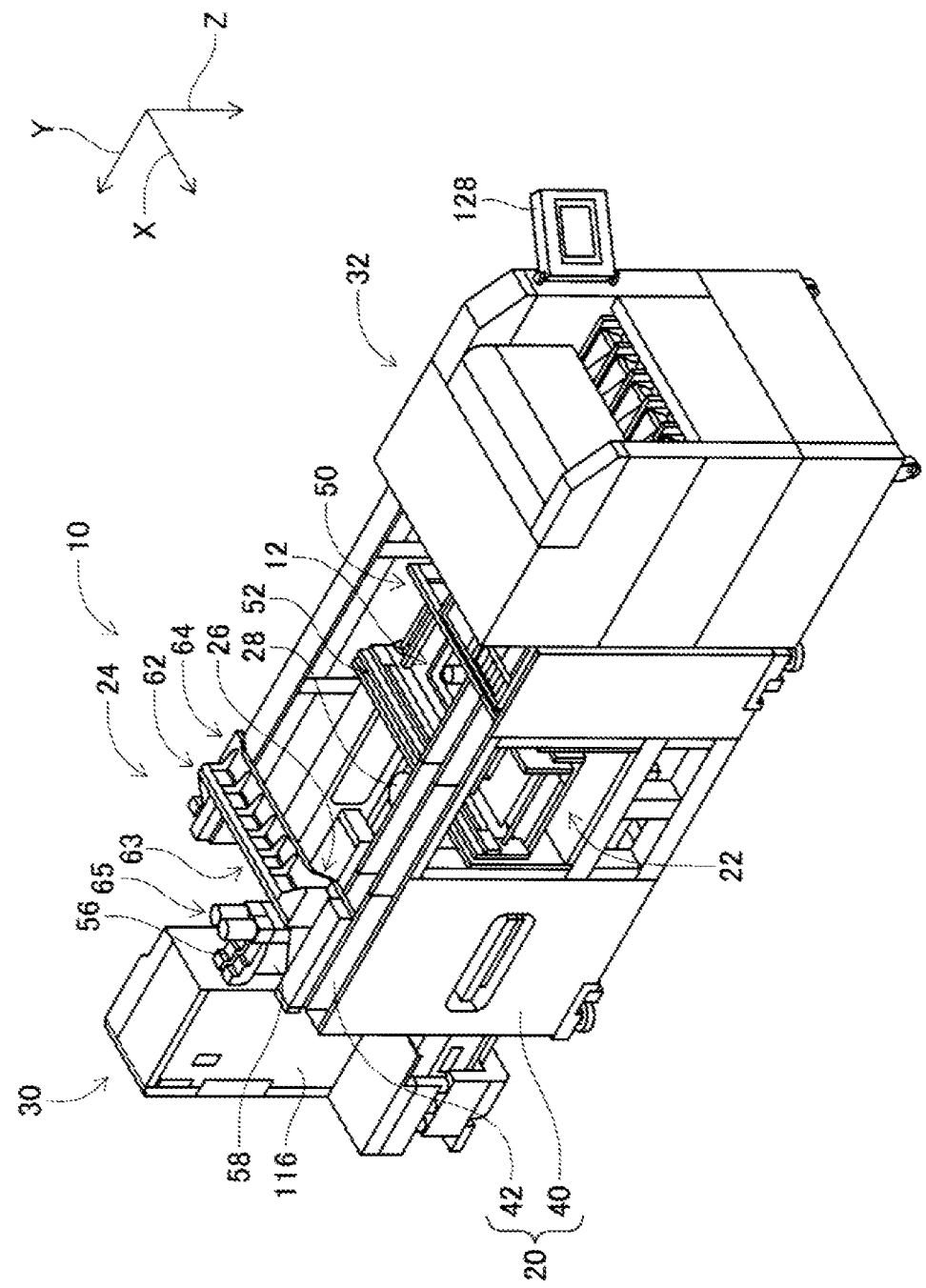
FIG. 1 is a perspective view showing a component mounter.

FIG. 1 shows component mounter 10. Component mounter 10 constitutes a device for mounting a component on circuit substrate 12. Component mounter 10 includes device main body 20, substrate conveyance and holding device 22, component mounting device 24, mark camera 26, part camera 28, component supply device 30, bulk component supply device 32, and control device (refer to FIG. 8) 36. A circuit board, a three-dimensionally constructed substrate, and the like are raised as circuit substrate 12, and a printed wiring board, a printed circuit board, and the like are raised as circuit substrate 12.

Device main body 20 is made up of frame section 40 and beam section 42 provided on frame section 40. Substrate conveyance and holding device 22 is provided at a center of frame section 40 in a front-rear direction thereof and includes conveyance device 50 and clamp device 52. Conveyance device 50 constitutes a device configured to convey circuit substrate 12, and clamp device 52 constitutes a device configured to hold circuit substrate 12. As a result, substrate conveyance and holding device 22 conveys circuit substrate 12 and holds fixedly circuit member 12 in a predetermined position. In the following description, a conveyance direction of circuit substrate 12 is referred to as an X direction, a horizontal direction at right angles to the X direction is referred to as a Y direction, and a vertical direction is referred to as Z direction. That is, a width direction of component mounter 10 constitutes the X direction, and a front-rear direction thereof constitutes the Y direction.

Component mounting device 24 is provided at beam section 42 and includes two work heads 56, 58 and work head moving device 62. Work head moving device 62 is comprised of X-direction moving device 63, Y-direction moving device 64, and Z-direction moving devices 65. X-direction moving device 63 and Y-direction moving device 64 include electromagnetic motors (refer to FIG. 8) 66, 68, respectively. Then, when individual electromagnetic motors 66, 68 operate, two work heads 56, 58 move together to arbitrary positions on frame section 40. Z-direction moving devices 65 includes corresponding electromagnetic motors (refer to FIG. 8) 70, 72, and when individual electromagnetic motors 70, 72 operate, sliders 74, 76 move individually in an up-down direction. Then, work heads 56, 58 are detachably mounted on sliders 74, 76, respectively. As a result, work heads 56, 58 are moved individually in the up-down direction by Z-direction moving devices 65.

Figure 2:
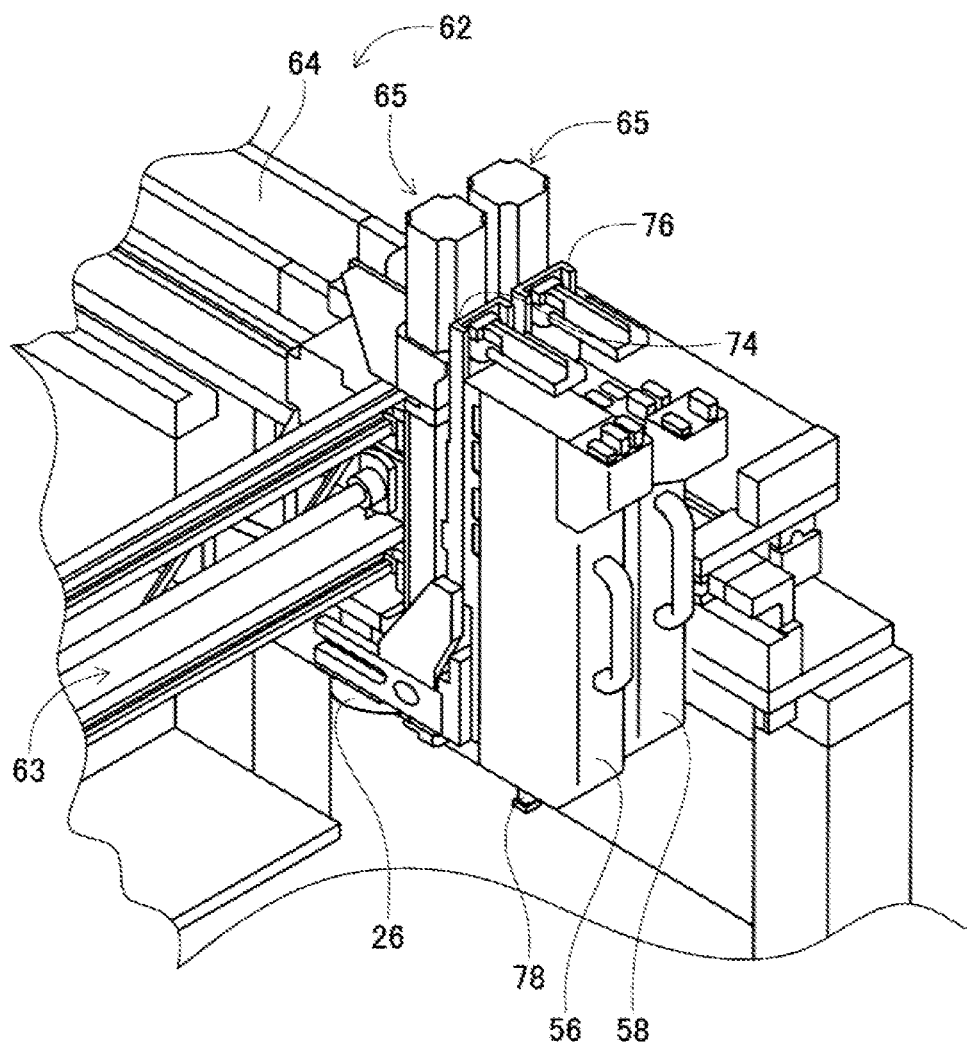
FIG. 2 is a perspective view showing a component mounding device of the component mounter.
Figure 3:
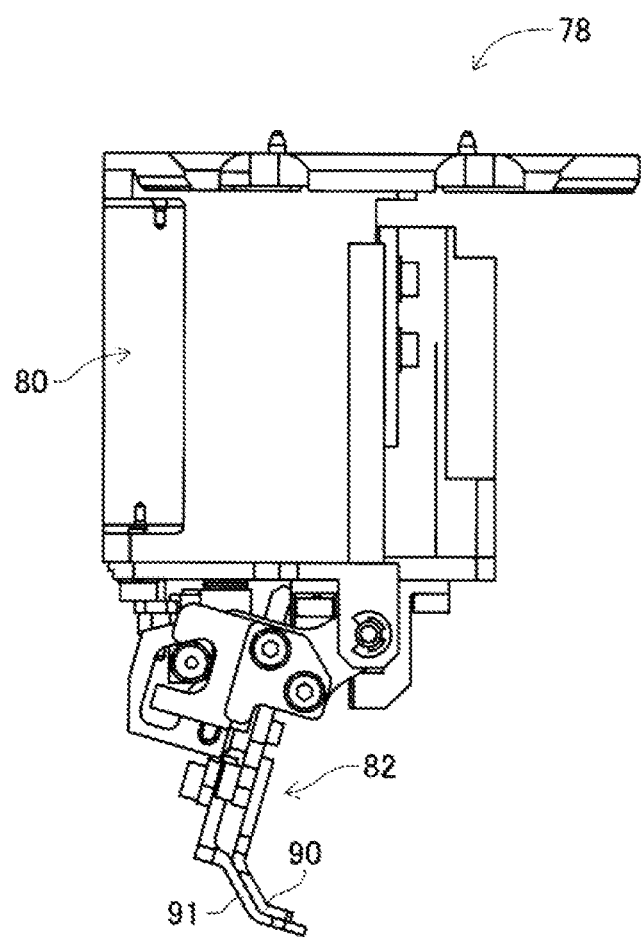
FIG. 3 is a side view showing a component holding tool.
Figure 4:
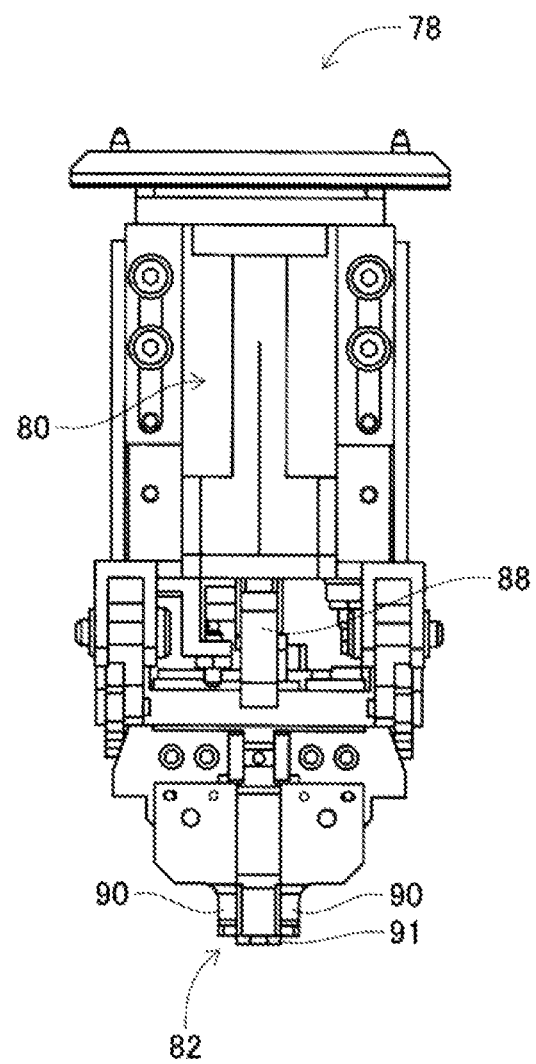
FIG. 4 is a front view showing the component holding tool.
Figure 5:
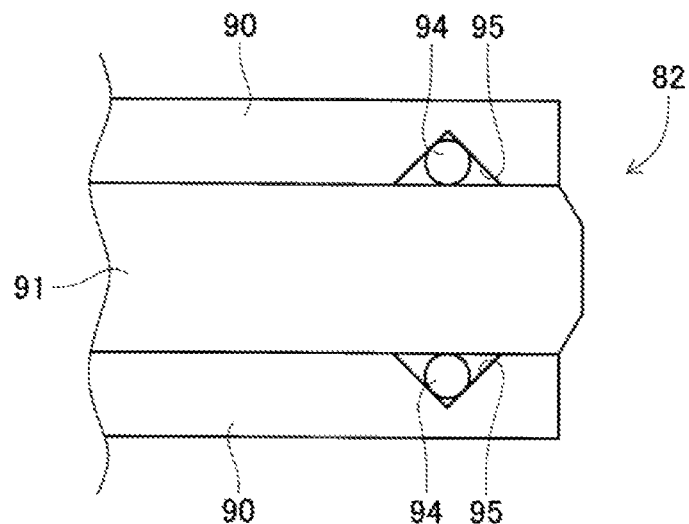
FIG. 5 is an enlarged view of an arm section.
Figure 6:
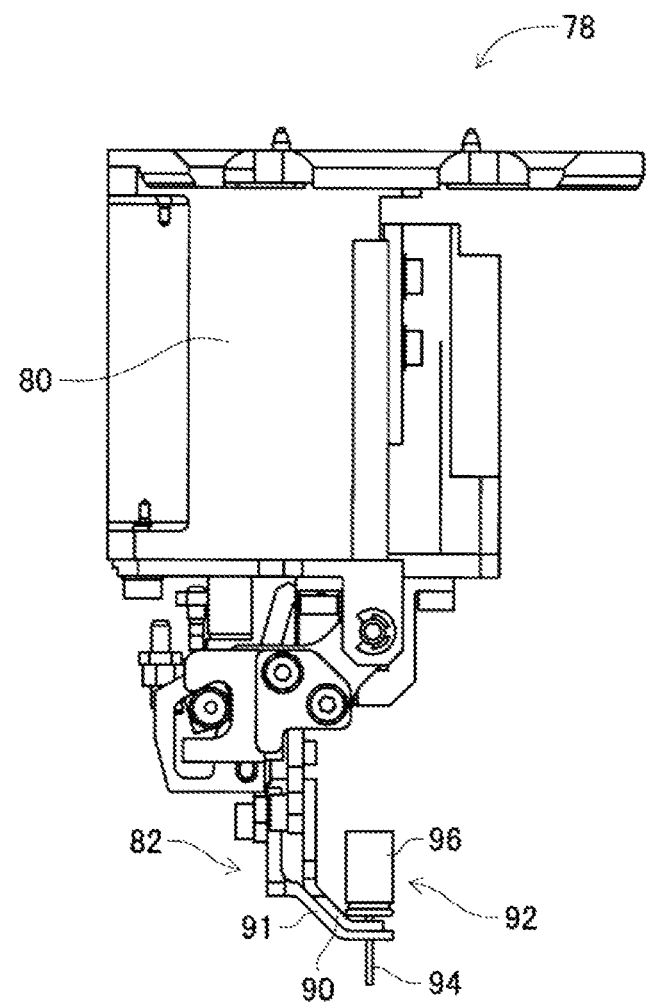
FIG. 6 is a side view showing the component holding tool.

Component holding tool 78 is attached to a lower end face of each of work heads 56, 58 as shown in FIG. 2. Component holding tool 78 holds lead wires of a lead component and includes main body section 80, arm section 82, opening and closing device (refer to FIG. 8) 86, pusher 88, and air cylinder (refer to FIG. 8) 89, as shown in FIGS. 3 to 6. Incidentally, FIG. 3 is a side view of component holding tool 78, FIG. 4 is a front view of component holding tool 78, FIG. 5 is an enlarged view showing arm section 82 as viewed from an observing point lying therebelow, and FIG. 6 is a side view of component holding tool 78 which is holding lead component 92.

Arm section 82 is made up of pair of claw sections 90 and auxiliary plate 91. Pair of claw sections 90 are held by main body section 80 in such a manner as to swing, and when opening and closing device 86 operates, distal end portions of pair of claw sections 90 move towards and away from each other while pair of claw sections 90 are swinging. Recessed portion 95, corresponding in size to a diameter of lead 94 of lead component 92 which constitutes a holding target, is formed on an inner side of each of pair of claw sections 90. Additionally, auxiliary plate 91 is situated between pair of claw sections 90 and swings together with pair of claw sections 90. That is, pair of claw sections 90 and auxiliary plate 91 swing together between a state shown in FIG. 3 (hereinafter, referred to as a "release state" from time to time) and a state shown in FIG. 6 (hereinafter, referred to as a "gripping state" from time to time). Then, when pair of claw sections 90 and auxiliary plate 91 swing together towards the gripping state, auxiliary plate 91 enters a space defined between pair leads 94 of lead component 92, and pair of claw sections 90 approach auxiliary plate 91. At this time, each of pair of leads 94 of lead component 92 is held by the recessed portion on claw section 90 and auxiliary plate 91 from both sides. As a result, as shown in FIG. 6, lead component 92 is held by arm section 82 at proximal end portions of leads 94, that is, end portions of leads 94 which lie closer to component main body 96.

Pusher 88 is held by main body section 80 in such a manner as to move in the up-down direction and is caused to ascend and descend as air cylinder 89 operates accordingly. When it descends, pusher 88 comes into contact with component main body 96 of lead component 92 which is held by arm section 82 to thereby press down lead component 92 in a downward direction. When lead component 92 is pressed down in the downward direction by pusher 88, arm section 82 then releases leads 94 that arm section 82 has held until then. That is, arm section 82 is swung from the gripping state towards the release state, so that arm section 82 releases lead component 92 that arm section 82 has held until then.

Figure 7:
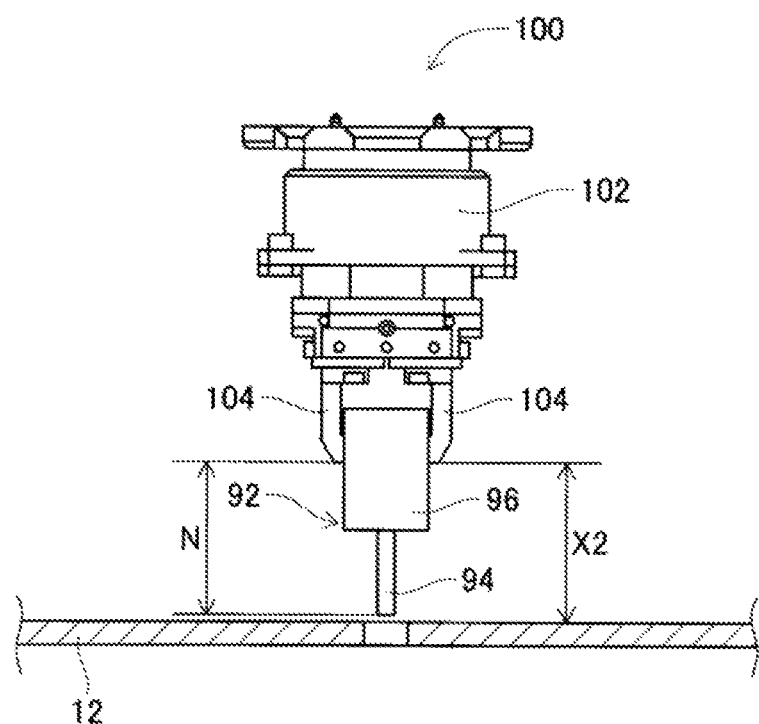
FIG. 7 is a drawing showing the component holding tool.

Component holding tools 78 are detachably attached to corresponding work heads 56, 58, so that component holding tools 78 can be exchanged for different component holding sections. Specifically, a nozzle station (whose illustration is omitted) is provided in component mounter 10, and component holding tools 100 like one shown in FIG. 7 are accommodated in the nozzle station. Then, component holding tools 78 attached to work heads 56, 58 are exchanged for component holding tools 100 accommodated in the nozzle station as required.

Component holding tool 100 includes main body section 102 and pair of claw sections 104. Pair of claw sections 104 are provided in such a manner as to extend downwards from a lower surface of main body section 102 and slide in such a manner as to move to and away from each other. As a result, component holding tool 100 holds component main body 96 of lead component 92 with pair of claw sections 104 by causing pair of claw sections 104 to move to each other and releases lead component 92 by causing pair of claw sections 104 to move away from each other.

Mark camera 26 is attached to slider 74 in such a manner as to be directed downwards as shown in FIG. 2, so that mark camera 26 moves together with work head 56 in the X direction, the Y direction, and the Z direction. As a result, mark camera 26 images an arbitrary position on frame section 40. Part camera 28 is provided in such a manner as to be directed upwards between substrate conveyance and holding device 22 and component supply device 30 on frame section 40 as shown in FIG. 1. As a result, part camera 28 images components held by component holding tools 78 of work heads 56, 58.

Component supply device 30 is provided at one end of frame section 40 in the front-rear direction thereof as shown in FIG. 1. Component supply device 30 includes tray-type component supply device 116 and feeder-type component supply device (refer to FIG. 8) 118. Tray-type component supply device 116 is a device configured to supply components resting on a tray. Feeder-type component supply device 118 is a device configured to supply components using a tape feeder or a stick feeder (not shown).

Bulk component supply device 32 is provided at the other end of frame section 40 in the front-rear direction thereof. Bulk component supply device 32 is a device configured to align multiple components scattering in bulk so as to be oriented properly for supply and supply them in the aligned state. That is, bulk component supply device 32 is a device configured to align multiple components in arbitrary postures so as to be oriented into a predetermined posture for supply and supply them in the predetermined posture.

Figure 8:
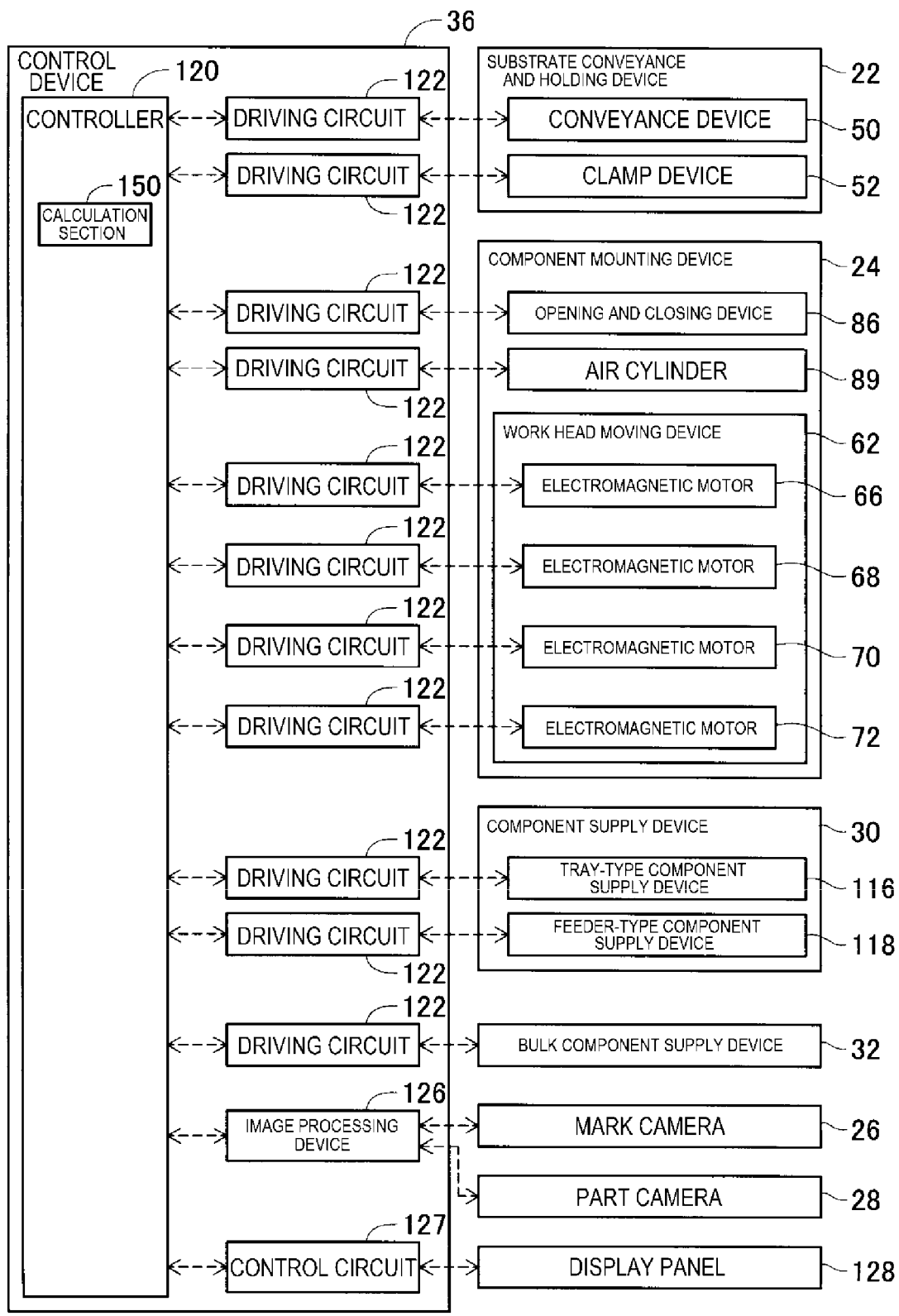
FIG. 8 is a block diagram showing a control device.

Control device 36 includes controller 120, multiple driving circuits 122, image processing device 126, and control circuit 127, as shown in FIG. 8. Multiple driving circuits 122 are connected to conveyance device 50, clamp device 52, electromagnetic motors 66, 68, 70, 72, opening and closing device 86, air cylinder 89, tray-type component supply device 116, feeder-type component supply device 118, and bulk component supply device 32. Controller 120 includes CPU, ROM, RAM, and the like, is made up mainly of a computer, and is connected to multiple driving circuits 122. As a result, controller 120 controls operations of substrate conveyance and holding device 22, component mounting device 24, and the like.

Controller 120 is also connected to image processing device 126. Image processing device 126 processes image data obtained by mark camera 26 and part camera 28, and controller 120 acquires various types of information from the image data. Controller 120 is further connected to control circuit 127, and control circuit 127 is then connected to display panel (refer to FIG. 1) 128 provided at bulk component supply device 32. As a result, an arbitrary image is displayed on display panel 128 in accordance with a command from controller 120. Controller 120 includes calculation section 150, and although will be described in detail later, calculation section 150 calculates a procedure of mounting components by component mounter 10.

Operation of Component Mounter

Being configured as described above, component mounter 10 mounts components on circuit substrate 12 held by substrate conveyance and holding device 22. Although component mounter 10 can mount various types of components on circuit substrate 12, there will be described below a case in which lead components 92 held by component holding tools 78 are mounted on circuit substrate 12.

Specifically, circuit substrate 12 is conveyed to a working position and is held fixedly by clamp device 52 in the working position. Next, mark camera 26 moves to a position above circuit member 12 and images circuit member 12. Then, controller 120 calculates information on a holding position of circuit substrate 12 or the like based on the imaged data. Component supply device 30 or bulk component supply device 32 supplies lead components 92 on to circuit substrate 12 in a predetermined supply position. Then, work heads 56, 58 to which component holding tools 78 are attached move to a position above the supply position, whereby lead components 92 are held by component holding tools 78.

Next, when lead components 92 are held by holding tools 78, component holding tools 78 move to a position above part camera 28, whereby lead components 92 held by component holding tools 78 are imaged by part camera 28. Then, controller 120 calculates position coordinates in the X and Y directions of distal ends of leads 94 of lead components 92 based on the imaged data.

Following this, work head moving device 62 is caused to operate so that position coordinates in the X and Y directions of through holes (refer to FIG. 9) 130 formed in circuit substrate 12 coincide with the position coordinates in the X and Y directions of the distal ends of leads 94. As a result, component holding tools 78 holding lead components 92 move to positions above through holes 130 formed in circuit substrate 12, so that through holes 130 coincide in position with the corresponding distal ends of leads 94 in the up-down direction.

Figure 9:
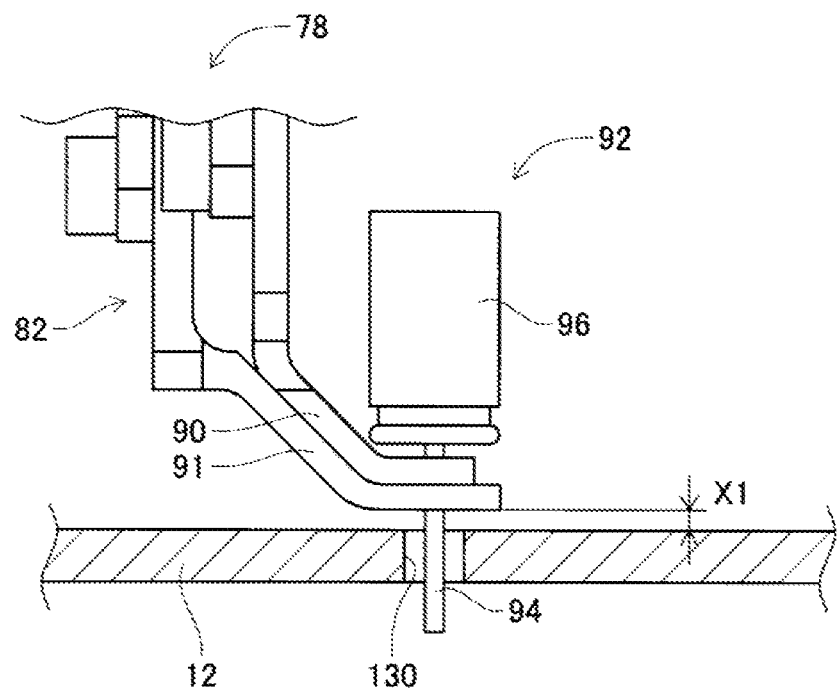
FIG. 9 is a drawing showing an operation of the component holding tool when a lead component is mounted.
Figure 10:
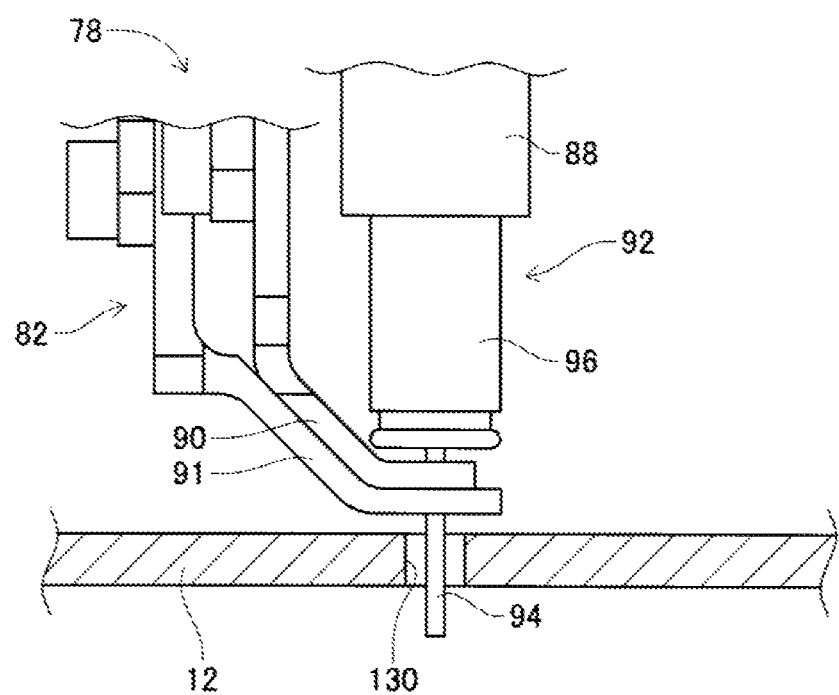
FIG. 10 is a drawing showing an operation of the component holding tool when the lead component is mounted.

Following this, the work head moving device 62 is caused to operate so that component holding tools 78 holding lead components 92 descend. As a result, as shown in FIG. 9, the distal ends of leads 94 of lead components 92 are inserted into corresponding through holes 130. Component holding tools 78 descend to a position where a distance between an upper surface of circuit substrate 12 and lower ends of arm portions 82 of component holding tools 78 becomes set distance X1 and then stop thereat. Next, air cylinders 89 operate so as to cause corresponding pushers 88 to descend, and when pushers 88 come into abutment with corresponding upper surfaces of component main bodies 96 of lead components 92 as shown in FIG. 10, lead components 92 are pressed down towards circuit substrate 12.

At this time, arm sections 82 are swung from the gripping state towards the release state, and arm sections 82 release leads 94 of lead components 92 that arm sections 82 have held until then. As a result, lead components 92 which are released from the gripped state by arm sections 82 are pressed down towards circuit substrate 12 by pushers 88, whereby leads 94 are inserted into corresponding through holes 130 until lower surfaces of component main bodies 96 come into contact with the upper surface of circuit substrate 12. In this way, component mounter 10 mounts lead components 92 gripped by component holding tools 78 on circuit substrate 12 with leads 94 kept inserted in corresponding through holes 130.

Calculation of Mounting Procedure by Arithmetic Section

Although component mounter 10 performs the mounting work in accordance with the procedure described above, since multiple components are mounted on the circuit substrate, there is a possibility that a lead component held by component holding tool 78 (hereinafter, referred to as a "held component") 92 comes into interference with a component that has already been mounted or loaded on the circuit substrate (hereinafter, referred to as a "pre-loaded component") when the lead component held by component holding tool 78 or the held component is mounted on the circuit substrate.

Figure 11:
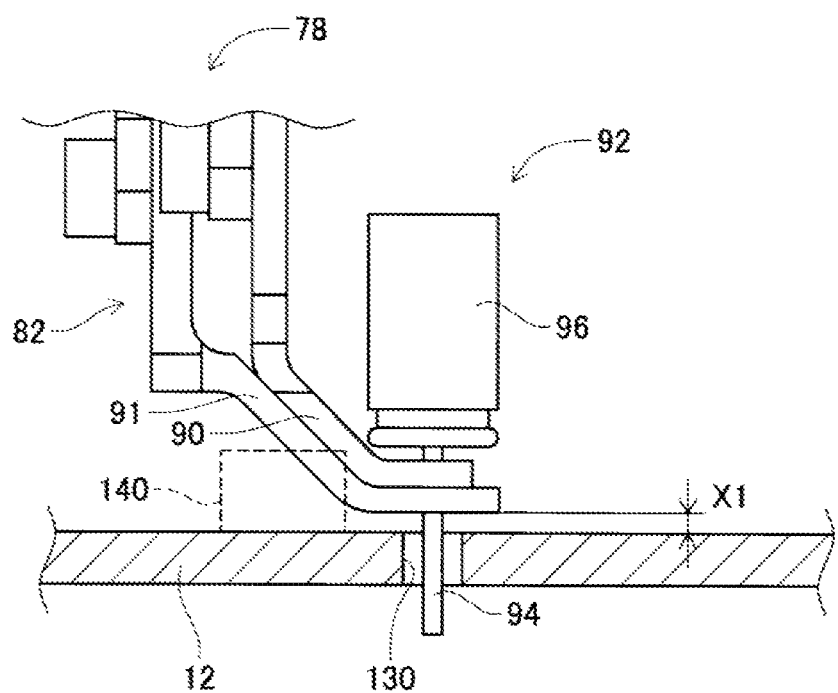
FIG. 11 is a drawing showing an operation of the component holding tool when the lead component is mounted.

Specifically, as shown in FIG. 11, there may be a case in which pre-loaded component 140 has already been mounted in a planned mounting position for held component 92, that is, in the vicinity of through hole 130 into which lead 94 of held component 92 is planned to be inserted before held component 92 is mounted. In this case, when component holding tool 78 is caused to descend to the position where the distance between the upper surface of circuit substrate 12 and the lower end of arm section 82 of component holding tool 78 becomes set distance X1 in order for lead 94 of held component 92 to be inserted into through hole 130, there is a possibility that component holding tool 78 comes into abutment with pre-loaded component 140. Then, a descending position of component holding tool 78 for a mounting operation is calculated in consideration of a height dimension of pre-loaded component 140, so that work head moving device 62 is caused to operate in accordance with a numeric value that is calculated, which turns out preventing component holding tool 78 from coming into interference with pre-loaded component 140.

Specifically, calculation section 150 of controller 120 stores information necessary for a mounting operation such as individual planned mounting positions of all components that are to be mounted on circuit substrate 12, dimensions of all the components, the dimension of component holding tool 78, the dimension of circuit substrate 12, and the like (hereinafter, referred to as "working information"). Then, calculation section 150 calculates a procedure of mounting components based on the working information so as to reduce a working time. Next, in mounting the components in accordance with the mounting procedure so calculated, calculation section 150 determines whether component holding tool 78 holding a mounting target component, that is, held component 92 comes into interference with pre-loaded component 140 when component holding tool 78 is caused to descend as downward as set distance X1. Here, calculation section 150 determines whether component holding tool 78 comes into interference with pre-loaded component 140 based on the mounting position of pre-loaded component 140, the planned mounting position of held component 92, the dimension of pre-loaded component 140, the dimension of component holding tool 78, and the like. Then, when calculation section 150 determines that component holding tool 78 comes into interference with pre-loaded component 140, calculation section 150 calculates a height for held component 92 at which lead 94 can be inserted into corresponding through hole 130 with component main body 96 of held component 92 kept separated away from circuit substrate 12 so that component holding tool 78 is prevented from coming into interference with pre-loaded component 140.

Figure 12:
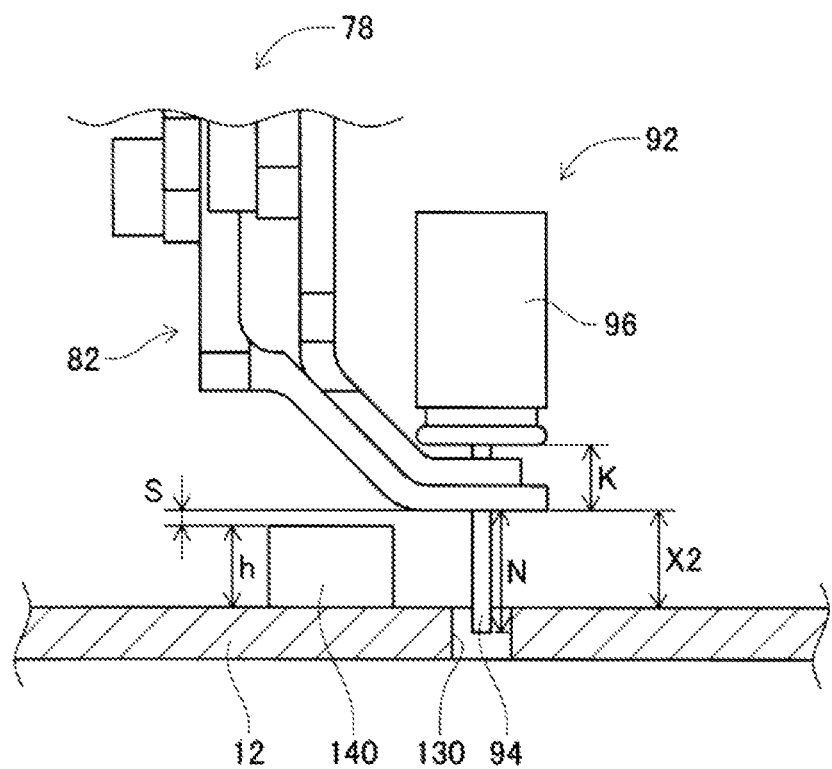
FIG. 12 is a drawing showing an operation of the component holding tool when the lead component is mounted.

Specifically, for example, as shown in FIG. 12, in the case that predetermined clearance S is taken into consideration for a height dimension of h for pre-loaded component 140, even though component holding tool 78 holding held component 92 is caused to descend to X2 (=h+S), component holding tool 78 does not come into contact with pre-loaded component 140. However, when component holding tool 78 is caused to descend to X2 (=h+S), component holding tool 78 needs to descend to a height at which the distal end of lead 94 of held component 92 can be inserted into through hole 130.

The height at which the distal end of lead 94 of held component 92 can be inserted into through hole 130 is a height at which lead 94 is inserted into through hole 130 as a result of its own weight or being pushed by pusher 88 when component holding tool 78 releases held component 92 that component holding tool 78 has held until then. Specifically, the height at which the distal end of lead 94 of held component 92 can be inserted into through hole 130 is, for example, a height at which the distal end of lead 94 of held component 92 held by component holding tool 78 is situated below the upper surface of circuit substrate 12. Additionally, the height at which the distal end of lead 94 of held component 92 can be inserted into through hole 130 is, for example, a height at which the distal end of lead 94 of held component 92 held by component holding tool 78 is situated between the upper surface and a lower surface of circuit substrate 12. Additionally, the height at which the distal end of lead 94 of held component 92 can be inserted into through hole 130 is, for example, a height at which the distal end of lead 94 of held component 92 held by component holding tool 78 is situated slightly (on the order of 1 mm) higher than the upper surface of circuit substrate 12. Incidentally, in this disclosure, the height at which the distal end of lead 94 of held component 92 can be inserted into through hole 130 is the height at which the distal end of lead 94 of held component 92 held by component holding tool 78 is situated below the upper surface of circuit substrate 12.

In the case that a length dimension of lead 94 is referred to as L and that a distance from an upper end of lead 94, that is, an end of lead 94 which lies to face component main body 96 to a lower end of arm section 82 where lead 94 is gripped is referred to as K, a length dimension of lead 94 which extends from the lower end of arm section 82 (hereinafter, referred to as an "extending dimension") N becomes (L−K). Then, in the case that the extending dimension N (=L−K) is longer than X2 (=h+S), when component holding tool 78 is caused to descend to X2 (=h+S) as shown in FIG. 12, the distal end of lead 94 of held component 92 is situated below the upper surface of circuit substrate 12.

Then, with the distal end of lead 94 of held component 92 situated below the upper surface of circuit substrate 12, when component holding tool 78 releases held component 92 which component holding tool 78 has held until then, lead 94 is inserted into through hole 130 as a result of its own weight of held component 92 or being pushed by pusher 88. In consideration of this, in the case that extending dimension N (=L−K) is longer than X2 (=h+S), descending position X2 of component holding tool 78 is set at (h+S). That is, the height of held component 92 at which lead 94 can be inserted into through hole 130 with component main body 96 of held component 92 spaced apart from circuit substrate 12 is set as the descending position X2 (=h+S) of component holding tool 78 in order to prevent component holding tool 78 from coming into interference with pre-loaded component 140. Then, when work head moving device 62 is caused to operate based on descending position X2 so set, component holding tool 78 can be prevented from interfering with pre-loaded component 140 when held component 92 is mounted on circuit substrate 12.

Figure 13:
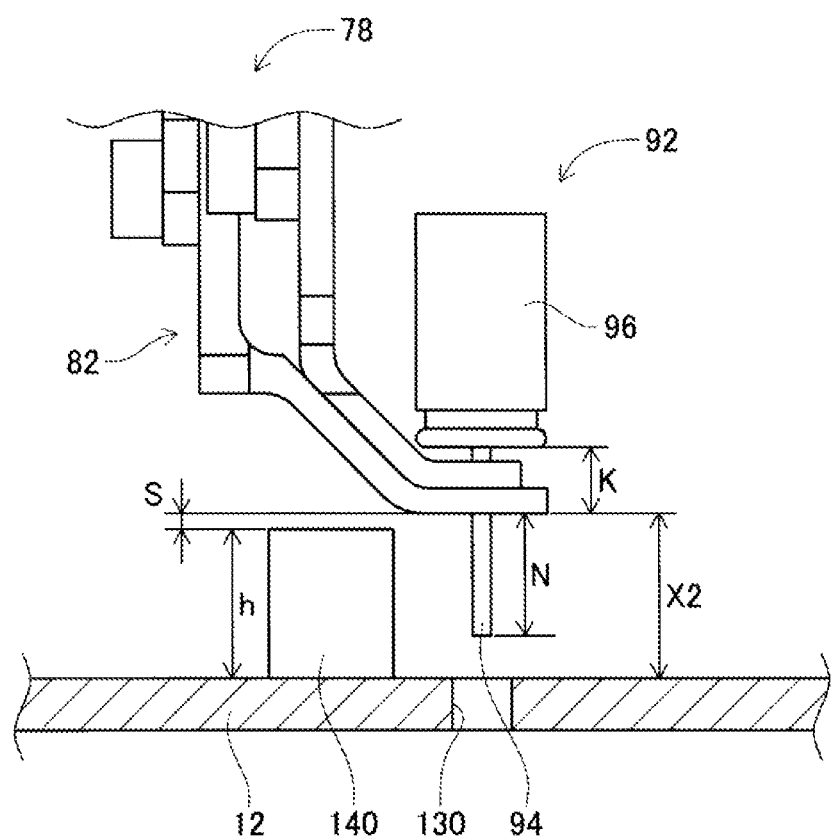
FIG. 13 is a drawing showing an operation of the component holding tool when the lead component is mounted.

In the case that extending dimension N (=L−K) is X2 (=h+S) or shorter, when component holding tool 78 is caused to descend to X2 (=h+S) as shown in FIG. 13, the distal end of lead 94 of held component 92 is situated above the upper surface of circuit substrate 12. At this time, when component holding tool 78 releases held component 92 which component holding tool 78 has held until then, there is a possibility that lead 94 cannot be inserted into through hole 130 as a result of its own weight of held component 92 or even though lead 94 is pushed by pusher 88. For this reason, in the case that extending dimension N (=L−K) is X2 (=h+S) or shorter, calculation section 150 determines that component holding tool 78 cannot be prevented from interfering with pre-loaded component 140 when held component 92 held by component holding tool 78 is mounted on circuit substrate 12.

At this time, when calculation section 150 determines that the interference of component holding tool 78 with pre-loaded component 140 cannot be avoided, in the case that held component 92 is held by component holding tool 100, calculation section 150 determines whether component holding tool 100 interferes with pre-loaded component 140. Then, when calculation section 150 determines that component holding tool 100 interferes with pre-loaded component 140, calculation section 150 calculates descending position X2 of component holding tool 100 for a mounting operation based on the height dimension of pre-loaded component 140 or the like. Since a method for calculating the descending position of component holding tool 100 is similar to the method for calculating the descending position X2 of component holding tool 78 described above, a description of the relevant calculating method will be omitted here. However, descending position X2 of component holding tool 100 for calculation of a descending position of component holding tool 100 is a distance between a lower end of component holding tool 100 and the upper surface of circuit substrate 12 as shown in FIG. 7. Additionally, extending dimension N is a distance between a location where held component 92 is gripped by lower ends of claw sections 104 and the distal end of lead 94.

Then, when calculation section 150 determines that component holding tool 100 can be prevented from interfering with pre-loaded component 140 when mounting work is performed, calculation section 150 sets component holding tool 100 as a holding tool for holding held component 92 and also sets descending position X2 for component holding tool 100. Then, in component mounter 10, component holding tools 78 attached to work heads 56, 58 are exchanged for component holding tools 100, and work head moving device 62 is caused to operate based on descending position X2 so set, whereby component holding tools 100 can be prevented from interfering with pre-loaded component 140 when mounting work is performed.

On the other hand, when calculation section 150 determines that component holding tool 100 cannot be prevented from interfering with pre-loaded component 140 when mounting work is performed, neither of component holding tool 78 and component holding tool 100 can be prevented from interfering with pre-loaded component 140 when in use. For this reason, as this occurs, an error is displayed on a screen of display panel 128. As a result, an operator recognizes that neither of component holding tool 78 and component holding tool 100 can be prevented from interfering with pre-loaded component 140 when in use. Then, the operator mounts held component 92 on circuit substrate 12 after component mounter 10 ends the mounting work or the like.

Component mounter 10 is described as an example of a work machine. Circuit substrate 12 is described as an example of a board. Work heads 56, 58 are described as an example of a holding head. Work head moving device 62 is described as an example of a moving device. Component holding tool 78 is described as an example of a holding tool. Lead component 92 is described as an example of a lead component and a held component. Lead 94 is described as an example of a lead. Component main body 96 is described as an example of a body. Component holding tool 100 is described as an example of a holding tool. Through hole 130 is described as an example of a hole. Pre-loaded component 140 is described as an example of a pre-loaded component. Arithmetic section 150 is described as an example of a calculation device.

In addition, the disclosure is not limited to the embodiment that has been described heretofore and hence can be carried out in various modes in which various modifications or improvements are made based on the knowledge of those skilled in the art to which the disclosure pertains. Specifically, for example, while chucks such as component holding tools 78, 100 are adopted as the holding tools in the embodiment described above, a suction nozzle or the like can be adopted.

While the dimension of pre-loaded component 140, the length dimension of lead 94, the gripping position of lead 94 by component holding tool 78, and the like are used in calculating descending position X2 for component holding tool 78 in the embodiment, a thickness dimension of circuit substrate 12, a stroke amount of the pusher, and the like can also be used for the same purpose.

While calculation section 150 makes up part of controller 120 of control device 36 in the embodiment described above, calculation section 150 may make up a different control device. That is, calculation section 150 may make up a control device which is independent of component mounter 10.

REFERENCE SIGNS LIST

10: Component mounter (work machine), 12: circuit substrate (board), 56: work head (holding head), 58: work head (holding head), 62: work head moving device (moving device), 78: component holding tool (holding tool), 92: lead component (held component), 94: lead, 96: component main body (body), 100: component holding tool (holding tool), 130: through hole (hole), 140: pre-loaded component, 150: calculation section (calculation device)

The invention claimed is:

1. A calculation device for a work machine comprising a holding head including a holding tool configured to hold a lead component comprising a lead and a body and a moving device configured to move the holding head, the calculation device calculating a release position of the lead component held by the holding tool, when the work machine mounts the lead component on a board by inserting the lead of the lead component held by the holding tool into a hole formed on the board by operating the moving device, wherein the calculation device is configured to calculate, when a held component constituting the lead component held by the holding tool is mounted on the board, a height to the held component as a release height at which the held component is released by the holding tool, the height to the held component being the height allowing the lead to be inserted into the hole without interference of the body of the held component and a pre-loaded component already mounted on the board, the calculation being performed based on a dimension of the pre-loaded component, a dimension of the lead of the held component, and a dimension of the holding tool.

2. The calculation device according to claim 1, wherein, when mounting the held component, the calculation device calculates the height to the held component as the release height at which the holding tool releases the held component, based on the dimension of the pre-loaded component, the dimension of the lead of the held component, and the dimension of the holding tool, the height to the held component being the height in a state that a distal end of the lead is inserted in the hole without interference of the body of the held component and the pre-loaded component.

3. The calculation device according to claim 1, wherein, when mounting the held component, the calculation device calculates the height to the held component as the release height at which the holding tool releases the held component, based on the dimension of the pre-loaded component, the dimension of the lead of the held component, and the dimension of the holding tool, the height to the held component being the height allowing the lead to be inserted in the hole without interference of the holding tool holding the held component and the pre-loaded component.

4. The calculation device according to claim 3, wherein, when interference of a first holding tool with the pre-loaded component is not avoided as a result of calculating a release height at which the first holding tool releases the held component, the calculation device calculates a release height at which a second holding tool releases the held component.

5. The calculation device according to claim 3, wherein, when interference of each of one or more holding tools with the pre-loaded component is not avoided as the results of calculating release heights at which the one or more holding tools each configured to hold the held component release the respective held components, the calculation device alerts an occurrence of error.

* * * * *